US006395095B1

(12) United States Patent
Jones et al.

(10) Patent No.: US 6,395,095 B1
(45) Date of Patent: May 28, 2002

(54) PROCESS APPARATUS AND METHOD FOR IMPROVED PLASMA PROCESSING OF A SUBSTRATE

(75) Inventors: William D. Jones; Robert C. Rowan; Edward L. Sill, all of Phoenix; Thomas J. Licata, Mesa, all of AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/334,046

(22) Filed: Jun. 15, 1999

(51) Int. Cl.⁷ .............................................. C23C 16/00
(52) U.S. Cl. .................. 118/728; 361/234; 204/298.15; 156/345.521
(58) Field of Search ..................... 361/234; 204/298.15; 156/345; 118/728; 216/37

(56) References Cited

U.S. PATENT DOCUMENTS

| 5,356,476 | A |   | 10/1994 | Foster et al. ................ 118/725 |
| 5,376,213 | A | * | 12/1994 | Ueda et al. .................. 156/345 |
| 5,567,267 | A | * | 10/1996 | Kazama et al. .............. 156/345 |
| 5,591,269 | A |   | 1/1997  | Arami et al. ............. 118/723 R |
| 5,708,556 | A |   | 1/1998  | van Os et al. ............... 361/234 |
| 5,737,175 | A |   | 4/1998  | Grosshart et al. ........... 361/234 |
| 5,820,723 | A |   | 10/1998 | Benjamin et al. ........... 156/345 |
| 5,835,334 | A | * | 11/1998 | McMillin et al. ............ 361/234 |
| 5,880,924 | A | * | 3/1999  | Kumar et al. ................ 361/234 |
| 5,886,866 | A |   | 3/1999  | Hausmann .................... 361/234 |
| 6,074,488 | A | * | 6/2000  | Roderick et al. ............ 118/728 |
| 6,108,189 | A | * | 8/2000  | Weldon et al. ............... 361/234 |
| 6,120,661 | A | * | 9/2000  | Hirano et al. ........... 204/298.15 |
| 6,136,211 | A | * | 10/2000 | Qian et al. ..................... 216/37 |

FOREIGN PATENT DOCUMENTS

| EP | 0 819 780 A2 | 1/1998 |
| EP | 0 819 780 A3 | 5/1998 |

OTHER PUBLICATIONS

Berry et al, "Control of the radio–frequency wave form at the chuck of an industrial oxide–etch reactor", J. Vac. Sci. Technol. A 18(6), Nov. 2000.*

Shan et al, "Process kit and wafer temperature effects on dielectric etch rate and uniformity of electrostatic chuck", J. Vac. Sci. Technol. B 14(1), Jan. 1996.*

* cited by examiner

*Primary Examiner*—Gregory Mills
*Assistant Examiner*—Rudy Zervigon
(74) *Attorney, Agent, or Firm*—Wood, Herron & Evans, L.L.P.

(57) ABSTRACT

A processing system for processing a substrate comprises a process chamber having a top, a bottom, and a sidewall defining a process space therein. The process chamber has an opening in the sidewall thereof for providing access to the process space. A plasma-generating assembly is coupled with the process chamber for creating a plasma within the process space. A substrate support assembly is configured for coupling with the process chamber to support a substrate within the process space. The substrate support assembly extends into the process space through the sidewall opening in the process chamber and seals the sidewall opening to generally isolate the process space from atmosphere.

15 Claims, 4 Drawing Sheets

PROCESS APPARATUS AND METHOD FOR IMPROVED PLASMA PROCESSING OF A SUBSTRATE

FIELD OF THE INVENTION

This invention relates generally to the processing of a substrate utilizing a plasma in the production of integrated circuits, and specifically relates to the improvement of plasma processing involving a plasma etch.

BACKGROUND OF THE INVENTION

Gas plasmas are widely used in a variety of integrated circuit fabrication processes, including plasma etching and plasma deposition applications. Generally, plasmas are produced within a process chamber by introducing a low-pressure process gas into the chamber and then directing electrical energy into the chamber for creating an electrical field therein. The electrical field creates an electron flow within the chamber which ionizes individual gas molecules by transferring kinetic energy through individual electron-gas molecule collisions. The electrons are accelerated within the electric field, producing efficient ionization of the gas molecules. The ionized particles of the gas and free electrons collectively form what is referred to as a gas plasma.

Gas plasmas are useful in a variety of different integrated circuit fabrication processes. One commonly used plasma process is a plasma etch process wherein a layer of material is removed or "etched" from a surface of a substrate. The ionized gas particles of the plasma are generally positively charged. Within an etching process, the substrate is negatively biased such that the positive ionized plasma particles are attracted to the substrate surface to bombard the surface and thereby etch the substrate surface. For example, a substrate might be etched to remove an undesired layer of material therefrom prior to the deposition of a desirable material layer or coating on the substrate. Such a pre-deposition etch process is often referred to as etch cleaning of the substrate.

Generally, there are various different ways of producing a plasma within a process chamber. For example, a pair of opposing electrodes might be oriented within the chamber to capacitatively couple electrical energy to the plasma. A microwave resonant chamber utilizing ultra-high frequency microwave fields might also be utilized. Electron cyclotron resonance (ECR) devices, on the other hand, use controlled magnetic fields to induce circular electron flow within a process gas to create and sustain a plasma. Inductive coupling processes are also popular, and are particularly desirable for their capability of producing a high-density plasma. Inductively coupled plasmas (ICP's) generally utilize a shaped coil or antenna positioned with respect to the process chamber to inductively couple energy into the chamber and thus create and sustain a plasma.

Various prior art processing systems have been utilized for the plasma processing of a substrate, such as plasma etching a substrate to clean a surface thereof. Despite the suitability of such systems for plasma etching and other plasma processing, these prior art systems have certain drawbacks associated therewith.

For example, conventional plasma processing systems often have very complicated designs which are not only difficult and expensive to manufacture and assemble, but the systems are also difficult and expensive to maintain. For example, plasma processing systems utilize numerous sub-systems which must be integrated together with a process chamber. Plasma processing systems utilize electrical energy sources for biasing a substrate. Those electrical energy sources are operably coupled to a substrate support within the process chamber through appropriate lines or cables. Furthermore, the system might utilize heating and/or cooling assemblies for heating or cooling the substrate while it is being processed. Still further, various clamping structures are utilized for maintaining the substrate on a support during processing, and lift structures are utilized for lifting the substrate after it has been processed so that the substrate may be transferred out of the processing system and into another processing system or module. Gas may be provided to the back side of a substrate mounted on a substrate support to enhance the heating of the substrate during processing.

As may be appreciated, the various electrical, thermal, gas, and mechanical sub-systems must be integrated or coupled with a substrate support within a process chamber. Current systems have complicated designs which are difficult and expensive to manufacture and maintain. The complexity of such systems often requires that the system be shut down for one or more days while it is repaired or certain components are replaced. The disassembly and reassembly of the components is tedious. Furthermore, such a lengthy shutdown decreases the efficiency of the overall plasma processing system, thus further increasing the costs of maintaining and operating such a system.

With respect to another aspect of conventional systems, the design of the substrate support utilized therein often exposes high voltage and high frequency electrical lines and connections to the plasma created within the process chamber. The exposed lines and connections, which are coupled to high frequency or high voltage electrical sources utilized to bias the substrate, may cause arcing and shorting within the plasma, and other plasma instabilities. Such plasma instabilities detrimentally affect the overall plasma process.

An additional drawback within conventional plasma processing systems is that such systems often do not efficiently heat the substrate being processed. The substrate support on which the substrate rests in the process chamber is usually made predominantly of metal and is coupled to other metal structures and components within the processing system. The thermal conduction properties of the metal support leads to significant conductive heat loss from the substrate support to the attached structures and components and thereby inefficient conductive heating of the substrate on the support. While backside gas has been utilized in the past to provide better heat conduction between the metal substrate support and the substrate, such backside gas is not always sufficient to overcome the heat loss characteristics of the overall substrate support and attached components. Furthermore, the inefficient heat transfer characteristics of existing process system substrate supports makes precise heating of the substrate difficult.

Still another undesirable characteristic of conventional plasma processing systems is that non-uniformity within the plasma often creates etching of the substrate. As a result, a substrate surface may be nonuniformly etched due to plasma discrepancies over the surface of the substrate. For example, the plasma is often more dense in the center of the process space and proximate the center of the substrate than proximate the outer edges of the substrate. Therefore, a greater etch rate may occur proximate the center of the substrate.

Accordingly, it is an objective of the present invention to improve upon conventional plasma processing systems, and specifically to improve upon plasma etching systems to provide a more uniform etch of a substrate.

It is another objective of the present invention to increase the operational efficiency of a system by reducing the complexities of the system and reducing the cost of repairing and maintaining the system.

It is further an objective of the invention to utilize a system which may be readily and efficiently maintained.

It is still another objective of the invention to improve the heating characteristics of a plasma process system for efficient, uniform heating of a substrate.

These objectives, and additional objectives will become more readily apparent from the description of the invention below.

SUMMARY OF THE INVENTION

The present invention addresses the above objectives and provides a processing system which may be readily and inexpensively maintained while providing efficient plasma processing, such as plasma etching, of the substrate. The system uniformly and efficiently heats a substrate and provides variable DC voltage profiling across a substrate to provide a uniform etch.

To that end, the processing system of the invention comprises a process chamber having a top, bottom, and a side wall which defines a process space therein. The process chamber has an opening in the side wall to provide access to the process space. A substrate support assembly comprising a hollow plenum and a platen extends into the process space through the side wall opening. The substrate support assembly seals the side wall opening and supports a substrate horizontally within the process chamber opposite a plasma-generating assembly that is coupled to the process chamber. The hollow plenum has a conduit formed therein through which external sub-systems, such as gas supplies, RF and DC power supplies, and a cooling water supply may be coupled to the platen. In that way, all sub-system connections to the platen are maintained within the plenum conduit which is isolated from the process chamber. The substrate support assembly, including the plenum and platen, may be readily removed from the process chamber for repair and/or replacement. The platen may be quickly and readily removed from the plenum and replaced as necessary by disconnecting the external sub-systems within the plenum conduit from the platen. In that way, the time for repair and/or replacement of the substrate support assembly is significantly reduced.

The platen is formed of a ceramic material and has a resistance heater and electrical grid embedded therein. The resistance heater is operated to provide the desired heating of a substrate for plasma processing. A metal tube having a low thermal conductivity and a significantly smaller diameter than the platen is coupled to the platen and to a mounting flange which is mounted to the plenum. The tube limits conductive heat loss from the platen to the flange and plenum, and thus provides more efficient and uniform heating of a substrate on the platen surface. A backside heating gas is pumped through the conduit of the plenum and through the small diameter tube to an opening within the platen to introduce a backside heating gas to a substrate on the platen. The various sub-systems of the plasma processing system are all coupled to the platen through the plenum conduit and tube and thus are isolated from the plasma processing environment. Such isolation increases the overall life span of the components, including the power supply components and significantly reduces shorting or arcing within the plasma caused by exposed power supply components.

The grid embedded within the platen is coupled to a DC power supply and to an RF power supply simultaneously. The grid comprises two poles which are biased with both the DC power supply and RF power supply. The poles are electrically isolated and the DC bias supply creates a stable DC bias between the poles which is effective to electrostatically secure or clamp a substrate to the platen. The RF power supply has a variable output and creates an RF-induced DC bias on the electrically isolated poles of the grid. The variable RF power supply is operable to create different RF-induced DC biasing between the electrically isolated poles of the grid. In that way, a variable DC voltage profile is created across the substrate which is clamped to the platen. By varying the DC voltage profile across the substrate, in accordance with the principles of the present invention, non-uniformities within the plasma may be addressed. For example, the invention may be utilized to increase the etch rate at the periphery of the substrate to offset the generally higher etch rate at the center of the substrate caused by nonuniformities within the plasma density.

In one embodiment of the invention, the poles of the electrical grid are in the form of a center disk and an outer ring concentrically aligned with the disk. Other pole shapes might also be utilized for the platen grid to create the desired DC voltage profile across the substrate being processed. Further details regarding the invention are set forth in the Detailed Description hereinbelow.

BRIEF DESCRIPTION OF THE FIGURES

The accompanying drawings, which are incorporated in and constitute a part of this specification, illustrate embodiments of the invention and, together with a general description of the invention given below, serve to explain the principles of the invention.

DETAILED DESCRIPTION

Figure 1:
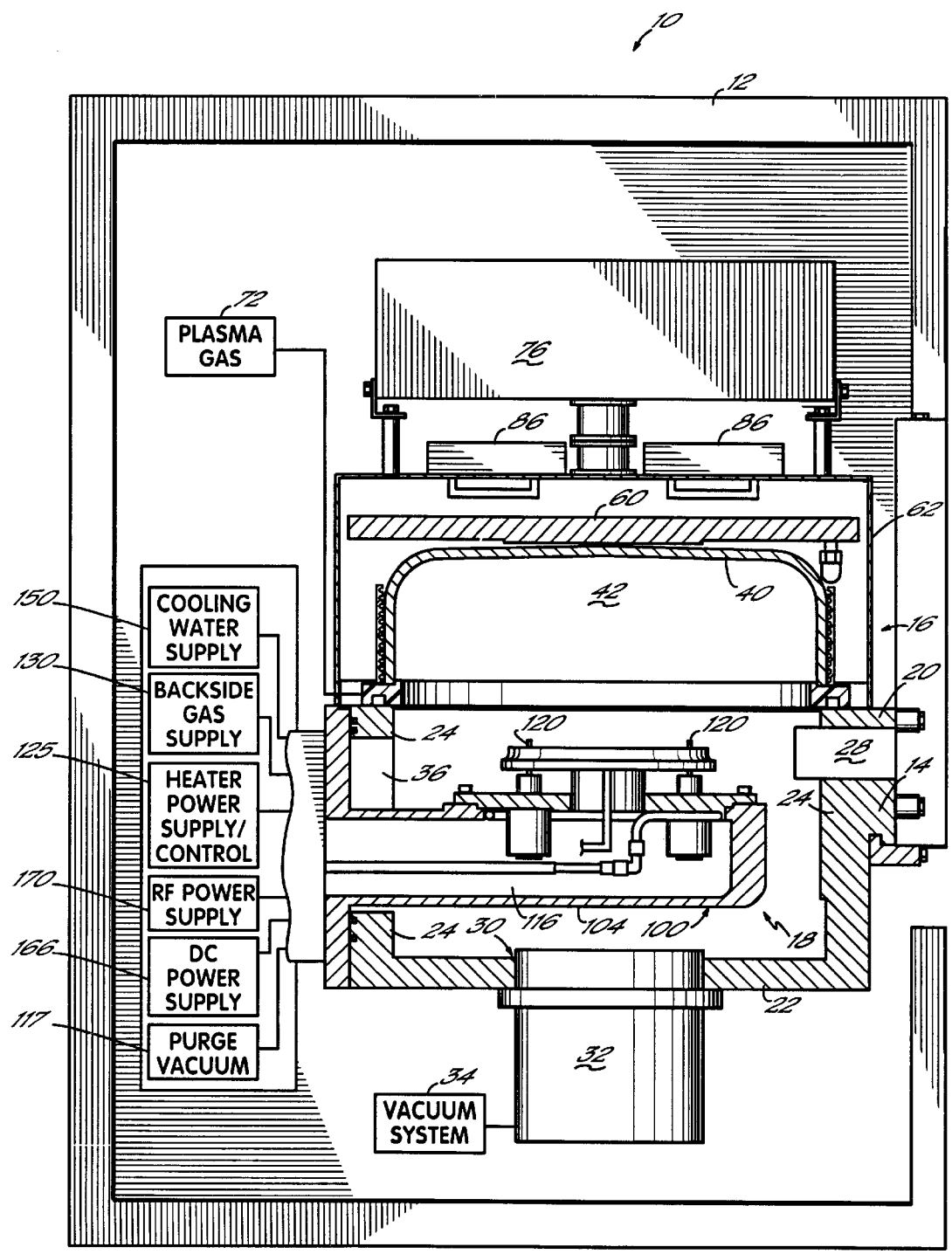
FIG. 1 is a side cross-sectional view of the plasma processing system in accordance with the principles of the present invention.

FIG. 1 illustrates one embodiment of a plasma processing system in accordance with the principles of the present invention. Plasma processing system 10 is enclosed within a housing 12, preferably formed of a suitable metal, such as stainless steel. System 10 includes a process chamber 14 and a plasma-generating assembly 16 coupled to the process chamber 14, as described further hereinbelow. A substrate support assembly 18 is positioned within the process chamber 14 and is configured for supporting a substrate therein for processing. The process chamber 14 has an open top 20, a bottom 22, and a side wall 24. The open top of chamber 14 interfaces with plasma-generating assembly 16. Process chamber 14 is formed of a suitable material such as stainless steel. Process chamber 14 defines a process space 26 therein.

In one embodiment of the present invention, system 10 may be a stand-alone plasma processing system which is utilized for an isolated plasma process. In another embodiment of the invention, as illustrated in the Figures, system 10 is configured to be incorporated into a multi-process system with a plurality of other processing systems and a centrally located substrate transfer module, not shown, which moves substrates between the various systems. Such substrate transfer modules and multi-chamber, multi-process systems are known in the art. Substrate transfer modules usually utilize robots (not shown) to manipulate and move substrates between the various processing systems according to a pre-determined sequence. For example, system 10 might be utilized as one processing system within a larger overall system wherein the system 10 is used for sputter-etch cleaning of a substrate surface prior to subsequent process steps that apply coatings to the cleaned surface of the substrate. To that end, the process chamber 14 shown in the Figures includes a robot aperture 28. System 10, and specifically chamber 14, couples to a substrate transfer module (not shown) through aperture 28 for allowing a robot access to the process space 26 to insert and remove substrates to be processed in system 10. The substrates are placed on and removed from substrate support assembly 18.

For plasma processing, process space 26 must be under vacuum. Thus the bottom 22 of chamber 14 includes an appropriate opening 30 formed therein for interfacing with a vacuum port 32. The vacuum port is coupled to an appropriate vacuum system 34 including suitable vacuum pumps and valves, as are known in the art, for providing the desired vacuum pressure within process space 26. Process chamber 14 also includes an opening 36 formed within the side wall 24 of the chamber, so that the chamber may easily and readily interface and be coupled with the substrate support assembly 18, as discussed further hereinbelow.

Figure 2:
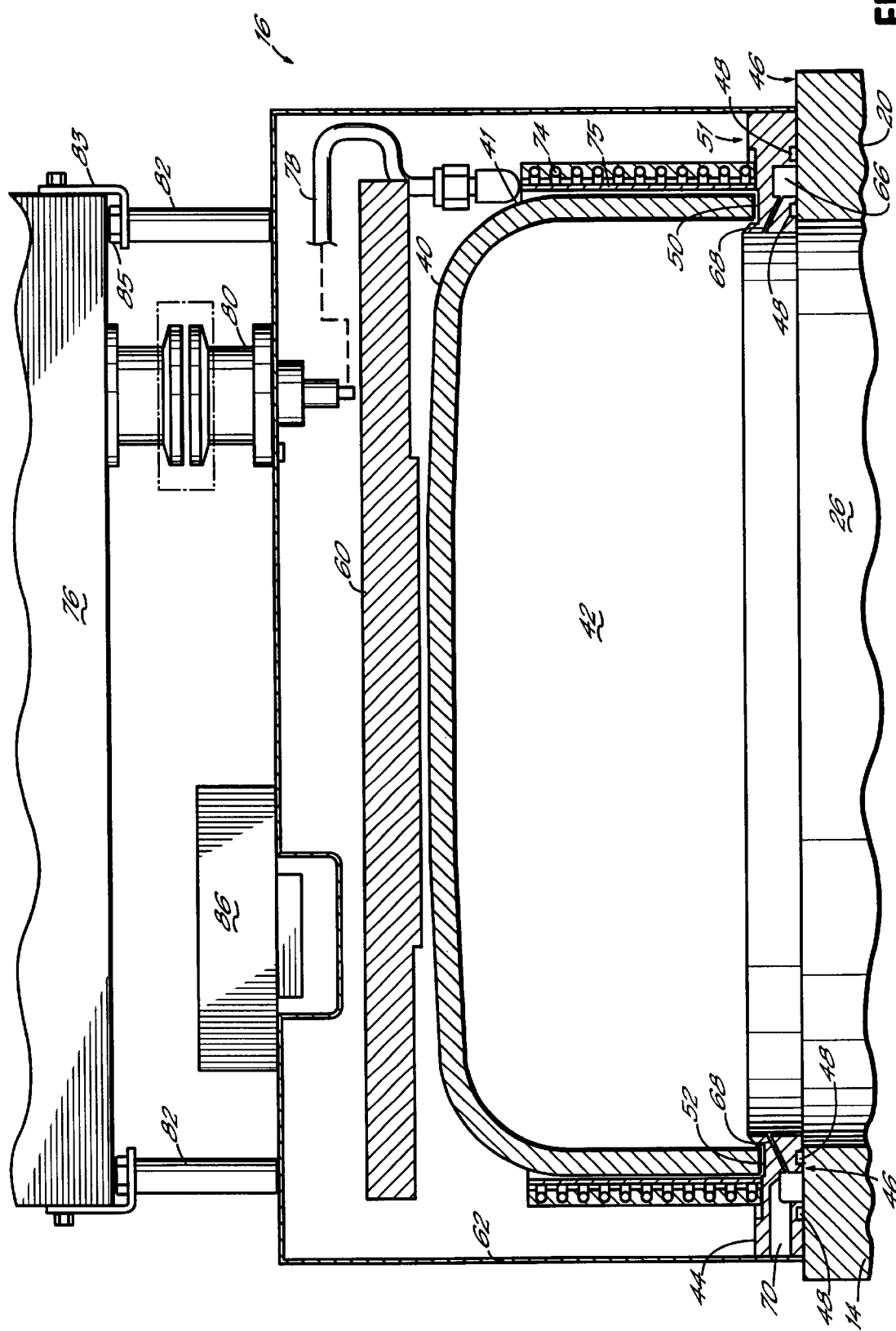
FIG. 2 is a cross-sectional view of a section of the system of FIG. 1.

Referring now to FIG. 2, the plasma-generating assembly 16 is shown coupled to the open top 20 of process chamber 14. The plasmagenerating assembly 16 comprises an enclosure 40 formed of a suitable dielectric material, such as quartz. The enclosure 40 is often referred to in the art as a "bell jar" type enclosure, and forms a plasma space 42 generally above the process space 26 and above substrate support assembly 18 (see FIG. 1). Enclosure 40 is seated on a flange 44 which surrounds the open top 20 of chamber 14. Open top 20 of chamber 14 includes a shelf surface 46 on which the enclosure 40 and flange 44 rest. More specifically, as shown in FIG. 2, flange 44 is a ring-shaped flange which surrounds the open top 20 and rests on surface 46. Suitable O-ring seals 48, such as Viton rubber seals, are positioned in appropriately formed annular grooves within flange 44. In that way, flange 44 is properly sealed for vacuum purposes to chamber 14. The bottom edge of the enclosure 40 rests within an annular groove 50 formed in the top surface 51 of flange 44. A flat ring seal 52 is positioned within groove 50 and is compressed between the enclosure 40 and the flange to seal the interface between the enclosure and flange. Flange 44 is formed of an appropriate material, such as stainless steel.

Holding enclosure 40 securely seated within flange 44 and within groove 50 is a plate 60 formed of a dielectric material such as quartz. Referring to FIG. 2, the plate 60 is held down against the top of the enclosure 40. Plate 60 is secured to the chamber 14 by suitable fasteners, such as tie-rods (not shown), to force the plate downwardly against the top of the enclosure for securing enclosure 42 to flange 44, and simultaneously securing the flange 44 against the top 20 of the chamber 14. A cap 62 of sheet metal is positioned around the enclosure 40 and other components of the plasma-generating assembly 16 to shield the plasma space 42 from electrical noise, and also to protect personnel utilizing system 10 from electrical shock from electrical components associated with the plasmagenerating assembly 16.

For forming a plasma within space 42, a process gas is introduced into the space 42 and electrical energy is electrically coupled into the space to ionize the gas particles to form a plasma. To that end, flange 44 includes an annular groove 66 formed within and around the flange 44. The groove 66 in combination with chamber surface 46 forms an annular gas passage. A plurality of radially-oriented gas injection holes are formed within flange 44 and are coupled with the passage formed by the annular groove 66. A port 70 is coupled to the annular groove 66, and is connected to a plasma gas supply 72 (see FIG. 1) for introducing a suitable plasma gas, such as argon, into the groove 66 and ultimately into plasma space 42. The radial gas injection holes 68 are angled upwardly from annular groove 66 to direct the process gas upwardly into space 42.

To ignite and sustain a plasma within space 42, an inductive element in the form of a helical coil 74 is wound around enclosure 40, as illustrated in FIG. 22. The coil 74 is essentially an elongated conductor formed in the shape of a helical coil which is dimensioned to fit around enclosure 40 and up against an outer wall surface 41 of the enclosure. Coil 74 is coupled to an RF power supply 76 through an appropriate RF line 78 and RF matching circuitry 80.

The RF power supply 76 for the conductive coil 74 is mounted on shield 62 and above enclosure 40 with suitable mounting hardware, including posts 82, brackets 83, and corresponding bolts 84, 85. Cooling fans 86 are utilized to cool the space within shield 62 surrounding the enclosure 40 by air convection. To assist with the inductive coupling of energy into plasma space 42, a Faraday shield 75 might be utilized and positioned between the coil 74 and the outer wall surface 41 of the enclosure 40. The use of Faraday shields is known in the art for inductively coupled plasmas, and such shields reduce capacitative coupling between the coil 74 and the plasma within space 42 while enhancing the desired inductive coupling of energy into the plasma. Faraday shield 75 will usually be electrically grounded.

Figure 3:
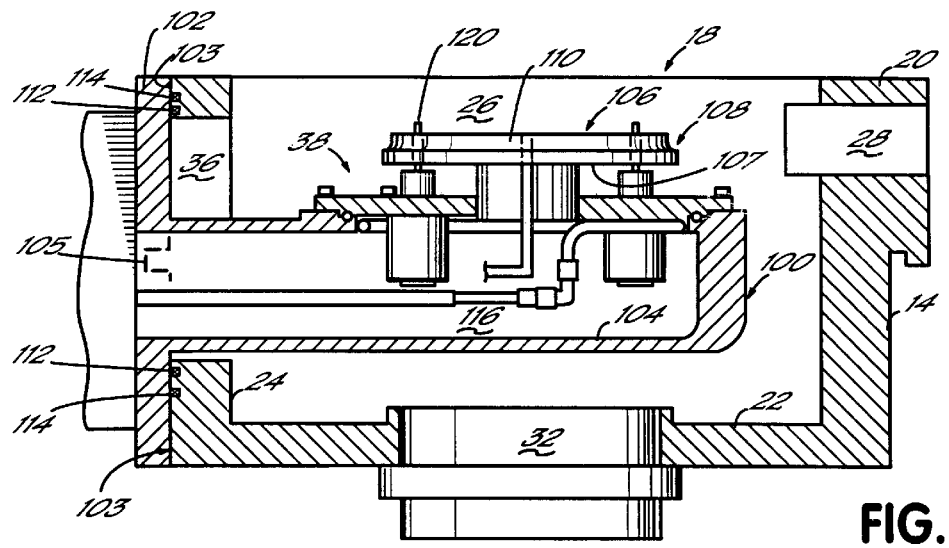
FIG. 3 is a cross-sectional view of another section of the system in FIG. 1.

Turning now to FIG. 3, the present invention incorporates chamber 14 having a side wall opening 36 and a substrate support assembly 18 which is configured for coupling with the process chamber 14 to support a substrate within the process space 26. The substrate support assembly extends into the process space through the side wall opening 36 and seals the side wall opening to generally isolate the process space from atmosphere. Substrate support assembly 18 is configured for supporting a substrate and includes the various lines, connectors, and other components for coupling to power supplies, gas supplies, water supplies, and other sub-systems associated with plasma processing of a substrate, as discussed below. The substrate support assembly 18 is configured to cantilever from the side wall of chamber 14 and may be quickly and easily removed, along with all the sub-system lines and connections, so that it may be readily repaired and/or replaced. The system 10 of the present invention is thereby easier and more inexpensive to repair and maintain than other plasma systems. The substrate support assembly 18 provides a simple design which incorporates all components of the substrate support into a single structure which may be easily coupled to and uncoupled from the process chamber. Furthermore, the substrate support assembly 18 isolates the connections and lines to the various sub-systems from the process space 26, and thus prevents undesirable electrical arcing and shorting within the plasma.

For example, the RF power supply, DC power supply, and associated electrical lines and components which are utilized to bias a portion of the substrate support assembly, in accordance with the principles of the present invention, are isolated from the plasma by the assembly 18 and thus are less susceptible to being affected by the plasma or, in turn, affecting or shorting the plasma within the process chamber 14. When a new substrate support assembly 18 is inserted to replace a malfunctioning substrate support assembly, the various sub-systems are externally connected with the assembly 18 and operate outside of and removed from the process space 26 and the plasma therein. Maintenance of the system is easy and efficient. For example, if a heater element within a substrate support assembly burns up and has to be replaced, the assembly 18 may be removed from the side of chamber 14 and a new heater component installed and connected to the appropriate external sub-systems within one to two hours, where it normally may take between one and two days to make such a repair/replacement with existing plasma systems.

Figure 4:
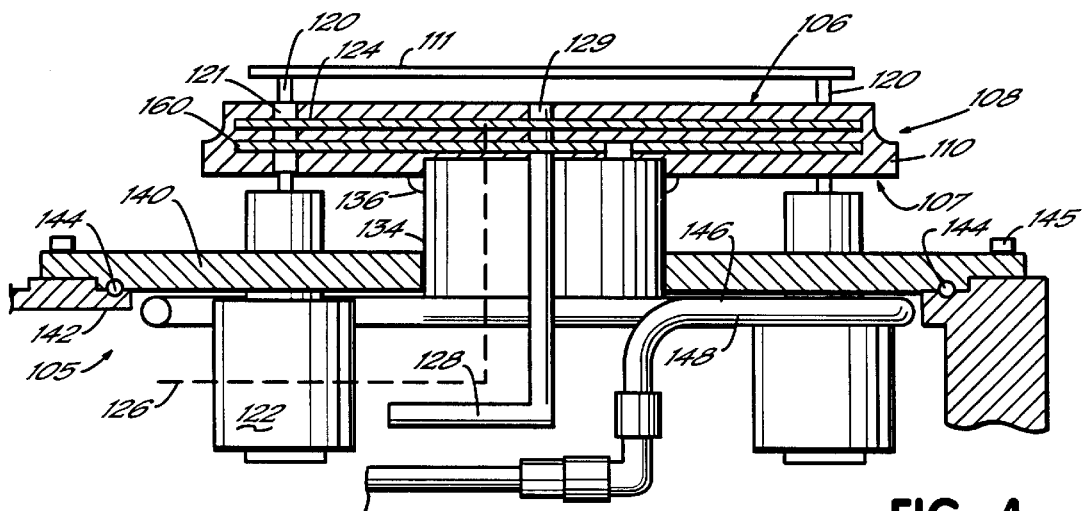
FIG. 4 is a cross-sectional view of a section of the substrate support utilized in the processing system of FIG. 1.

Turning now to FIG. 3, the substrate support assembly 18 is shown. The substrate support assembly includes a plenum 100 which extends laterally into the process space 26 and is cantilevered from a side wall of the process chamber 14. Plenum 100 includes a sealing collar 102 which extends generally perpendicularly with respect to the main body 104 of the plenum. When plenum 100 is inserted into opening 36 within the side wall 24, the collar 102 lies flush against an external side wall surface 103 of the process chamber proximate opening 36. The sealing collar 102 is held against surface 103 of the chamber 14 by an appropriate means, such as bolts (not shown) in order to support the cantilevered plenum 100 within the process space 26 and to seal chamber 14. An alignment pin 105 may be utilized for proper alignment of collar 102 and surface 103 for proper positioning of plenum 100. The alignment pin 105 may extend from either the chamber surface 103 or collar 102 to be positioned within a corresponding aperture in either one of the collar or chamber. Alignment pin 105 is illustrated in the figures as extending from chamber 14 to fit within an aperture (not shown) within collar 102. In the embodiments illustrated in the Figures, it is desirable that the alignment pin 105 seat with the collar 102 to maintain the plenum 100 such that a wafer supporting surface 106 is generally horizontal, as shown in FIGS. 3 and 4.

The substrate support assembly 18 includes a substrate mount 108 which is coupled to the plenum and positioned within the process space for supporting a substrate thereon. In the embodiment as illustrated in the Figures, the substrate mount includes a platen 110 having a wafer supporting surface 106 thereon. According to the principles of the invention as discussed hereinbelow, the platen 110 is utilized to heat the substrate, electrically bias the substrate, and generally support the substrate during processing. The platen is formed of a ceramic material, such as alumina, and includes a heater and an electrical grid. The heater is used to heat a substrate to a desirable temperature for processing, while the grid is utilized to electrostatically secure the substrate and also to electrically bias the substrate during the plasma process. In the embodiment of the present invention, as illustrated in FIG. 4 and discussed further hereinbelow, the heater and electrical grid are embedded within the ceramic platen 110.

When the plenum 100 is coupled to process chamber 14, appropriate seals are utilized at the interface between the collar 102 and chamber surface 103 to ensure a suitable vacuum environment within the process space 26 and to seal space 26 from atmosphere. To that end, a suitable vacuum seal 112 is utilized at the collar/surface interface. Furthermore, an RF gasket 114 is also utilized at that interface to ensure that the plenum 100 makes proper electrical contact with the chamber 14. In that way, the electrical potential of the chamber and the plenum are the same.

Plenum 100 is formed of an appropriate material such as stainless steel and has a conduit 116 formed within the main body 104 of the plenum. In accordance with the principles of the present invention, all of the sub-system connections to platen 110 which are utilized for plasma processing a substrate, are directed through the plenum conduit 116 and coupled to a back side 107 of the platen 110, and are thereby isolated from process space 26 and the plasma therein. Conduit 116 is effectively sealed from the inner plasma environment of process space 26 and may be coupled to atmosphere through the open end of the plenum. In an alternative embodiment of the invention, conduit 116 of the plenum may be coupled to a purge vacuum 117 for purging gas from the conduit 116 (see FIG. 1). All the platen subsystem connections, including the high voltage and high frequency electrical connections to the platen are isolated from the plasma and process space 26 inside plenum conduit 116.

Figure 5:
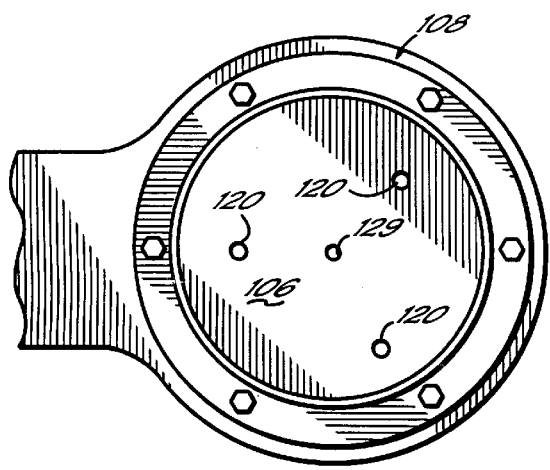
FIG. 5 is a top view of the substrate support of FIG. 4.

FIG. 4 shows an expanded view of the substrate mount, including platen 110. The substrate 111 is transferred into process chamber 14 through aperture 28 by a substrate transfer mechanism, such as a robot (not shown). The robot moves with the substrate through the aperture 28 to a position generally above surface 106 of the platen 110. The robot lowers the substrate 111 onto a plurality of lift pins 120 extending through appropriate openings 121 within platen 110. The present invention utilizes a series of three lift pins 120 which are spaced in a generally triangular pattern, as illustrated in FIG. 5 for supporting substrate 111, although additional lift pins might be utilized, such as a fourth lift pin to form a square pattern on the platen 110. Each of the lift pins 120 are coupled to a stepper motor 122 which operates to raise and lower the lift pins 120 and thereby raise and lower the substrate 111. The lift pins are in the raised position when the substrate transport structure places the substrate 111 thereon, as shown in FIG. 4. For processing, the pins 120 are lowered, thus lowering substrate 111 into contact with surface 106. After the substrate has been processed, such as with a plasma etch cleaning process, the lift pins are again raised so that the substrate transfer mechanism (not shown) may again engage the substrate 111 to remove it from the process chamber 14 and replace it with another substrate to be processed.

Platen 110 heats substrate 111 during plasma processing. To that end, embedded within the ceramic platen 110 is an AC resistance heater 124, such as a resistance heater available from NGK-Locke, Inc. of San Jose, California. Resistance heater 124 may be in the form of an embedded plate, as illustrated in FIG. 4, or might take other shapes suitable for heating substrate 111 on surface 106. For example, a heater might be simply attached to the platen 110, such as a heater from Watlow Batavia of Batavia, Ill. Heat is conductively coupled from the heater 124 through the platen 110 and thereby to the substrate 111 resting on platen surface 106. Heater 124 is coupled to an appropriate heater power supply/control unit or sub-system 125 for controlling the heater and heating the substrate to the desired temperature during plasma processing (see FIG. 1). Heater 124 is coupled to the heater power supply/control sub-system 125 through an appropriate line 126 which extends through the plenum conduit 116 and out to the external sub-system 125. In that way, the heater line 126 is isolated from the plasma process environment within chamber 14. Such heater power supply and control units are known in the art. The heater 124 is preferably operable in the range of room temperature to 550° C.

For more efficient heating of substrate 111, a backside gas is utilized and is directed through line 128 to an aperture 129 formed proximate the center of platen 110 (see FIG. 5). Line 128 is coupled to an appropriate backside gas supply 130 for delivering the backside gas to the surface 106 and against the substrate 111. The gas, such as argon, provides better heat transfer characteristics between platen surface 106 and the substrate 111 within the vacuum environment to provide for more uniform and efficient heating of the substrate 111, as is known in the art.

In existing plasma processing systems, heating of the wafer has been somewhat inefficient and imprecise, even when a backside gas is utilized. In such systems, the substrate support and related components are made of metal and suffer from significant heat loss characteristics. That is, heat is conducted away from a heated support surface to other undesirable portions or components of the substrate mount, rather than to a substrate sitting on the heated substrate surface. Therefore, thermal energy is wasted within the system and the substrate is inefficiently heated.

The present invention addresses such a drawback and provides a substrate support assembly which efficiently heats substrate 111 while reducing undesired dissipative heat loss. To that end, and referring to FIG. 4, the ceramic platen 110 is coupled to a short, and relatively small diameter tube 134. The tube 134 has a small diameter as compared to the overall diameter of the platen 110. The tube 134 is formed of a material which has low thermal conductivity and thus provides thermal isolation of platen 110 from the plenum 104 and other metal components of the substrate support assembly 18. Accordingly, tube 134 limits conductive heat loss from the ceramic platen 110 to other parts of a substrate support assembly so that heat may be efficiently conducted to substrate 111 as desired. Tube 134 further provides a space between conduit 116 and the back side 107 of the platen 110 which is isolated from the plasma and process space 26 for making suitable sub-system connections to the platen, such as platen connections to heater 124 and to the backside gas aperture 129. Hollow tube 134 is brazed circumferentially to the back side 107 of platen 110 with a vacuum tight braze indicated at 136 to isolate the inside of the tube from a plasma processing environment. The tube is preferably formed of a suitable metallic material having low thermal conductivity, such as Kovar metal, available from EFI of Los Alamitos, California. Kovar is a metal alloy selected for its thermal conductivity and thermal expansion properties and is an alloy of approximately 29% Ni, 17% Co, and the balance Fe. The thermal expansion of Kovar is appropriate for bonding by brazing to ceramics. When bonding a metal to a ceramic by brazing, the parts must be heated to melt the braze metal. Where alloys with a large coefficient of thermal expansion relative to ceramic may cause the braze joint to fail while cooling after the braze material is melted, Kovar has a coefficient of thermal expansion close to the coefficient of thermal expansion of the ceramic. The Kovar tube and braze joint may be plated with nickel or another metal to prevent the contamination of the process by the elements in the Kovar. Plating the braze joint and Kovar tube also prevents oxidation of the braze material that may lead to failure of the joint at the operating temperature of the heater.

The substrate mount 108 further includes a mounting flange 140 which is coupled to the platen 110 by tube 134. The mounting flange is formed of a suitable metal, such as stainless steel, and is configured for engaging the plenum body 104 to couple the platen 110 to the plenum.

Referring to FIGS. 3 and 4, the plenum body 104 has an opening 105 formed therein for providing access to the conduit 116 of the plenum. A shelf 142 is formed around the opening 105 of the plenum and the mounting flange 140 is appropriately configured for resting on and mounting to shelf 142 to seal the opening 105. An O-ring vacuum seal 144 is positioned between the mounting flange 140 and plenum shelf 142 in order to further seal the plenum conduit 116 from the process space. Appropriate fasteners, such as bolts 145, positioned around the outer edge of the flange 140 secure the flange to the plenum. Flange 140 includes a center opening therein through which the tube 134 extends. The tube 134 is welded to flange 140. Flange 140 is water-cooled, and to that end, the bottom of the flange includes a section 146 which is machined away to receive a cooling tube 148 containing water. The cooling tube extends around the flange proximate its outer edge, and proximate seal 144. In that way, the flange is cooled proximate the seal 144 to maintain the seal at a sufficiently low temperature for proper operation. Tube 148 is coupled to a suitable supply of cooling water 150, as illustrated in FIG. 1.

In accordance with one aspect of the present invention, the substrate mount 108, including the platen 110, tube 134, and flange 140, may be quickly removed from the plenum and replaced simply by unbolting flange 140 from the plenum. In that way, a new substrate mount can be rapidly installed without replacing the entire plenum, thus making maintenance of the system easier and more inexpensive and minimizing the downtime associated with the repair or replacement. The external sub-systems all couple with the substrate mount and platen through plenum conduit 116 and thus those sub-systems may be readily disconnected from the substrate mount, and specifically from the platen prior to repair or replacement of the platen.

Figure 6:
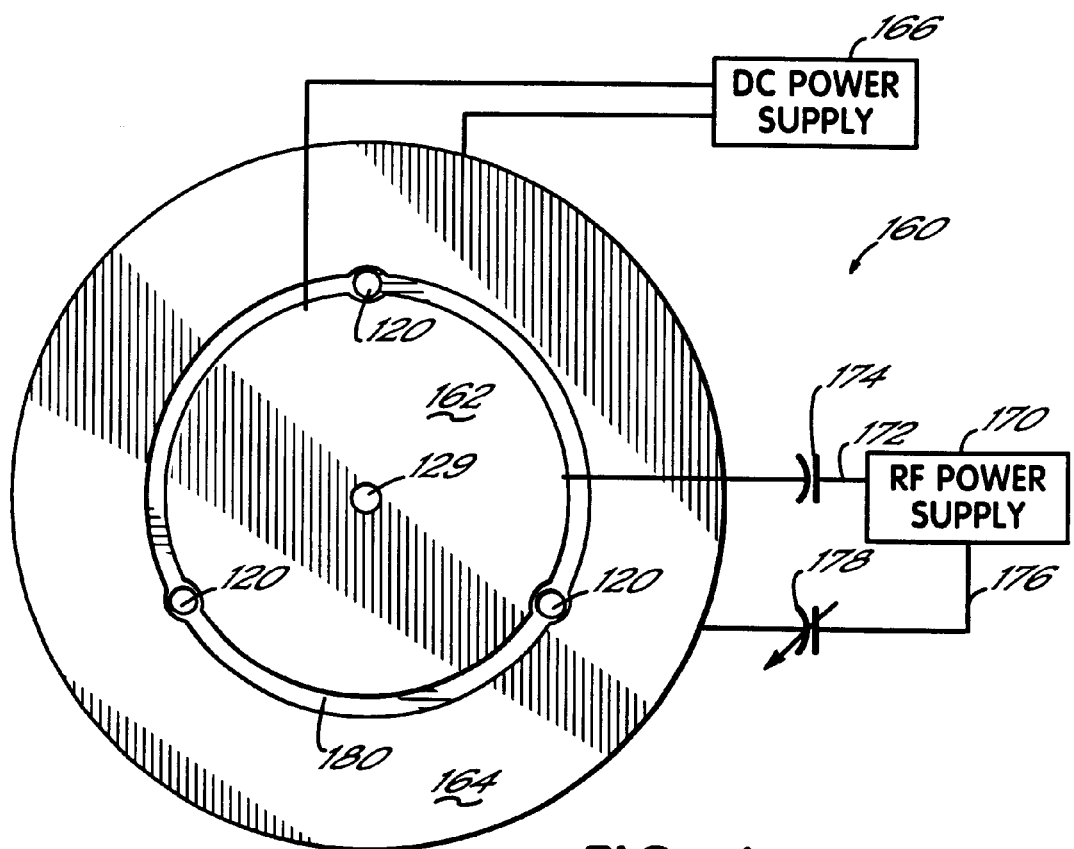
FIG. 6 is a top view of an electrical grid suitable for use within the substrate support of the inventive system.

Platen 110 also acts as an electrostatic chuck. To that end, and as illustrated in FIG. 4, an electrically conductive grid 160 is embedded within the ceramic platen 110. The grid is formed of a suitable metal such as molybdenum. Molybdenum is selected because its high melting point and coefficient of thermal expansion are similar to those of the ceramic plate, and because of the existence of technology that permits joining molybdenum with other materials (ceramics and metals) by brazing. In one embodiment of the invention, as illustrated in FIG. 6, the grid comprises a central disk 162 which is generally concentrically positioned with respect to the platen 110. An outer concentric ring 164 surrounds the disk 162. The disk 162 and ring 164 are not in contact with each other and are electrically isolated from each other in the platen. The disk 162 and the ring 164 act as opposite poles of the dipole electrostatic chuck grid 160. To that end, each of the disk 162 and ring 164 is coupled to an external DC power supply such that one of the elements is positively biased, and the other element is negatively biased with a DC voltage. The oppositely charged poles 162, 164 of the grid 160 operate to electrostatically clamp a substrate to platen 110 due to the DC bias on the two pole elements. In addition to electrostatically clamping a substrate 111 to the platen 110, grid 160 also biases substrate 111 with a DC bias for the purposes of attracting positively charged plasma ions to bombard the surface of the substrate and thereby etch or clean that surface.

As noted above, certain non-uniformities exist within a plasma. For example, inductively coupled plasmas tend to be more dense proximate the center of the process chamber and the center of the substrate than around the side walls and peripheral edge of the substrate. The non-uniformity of the plasma density leads to a non-uniform etch rate on the substrate. For example, the center of the substrate may be etched at a greater rate than the edges. The present invention addresses such non-uniformity by coupling the grid 160 to an RF power supply in addition to the DC power supply which biases the electrostatic grid. Referring to FIG. 6, an RF power supply 170 is coupled to grid 160 of the platen 110 through the plenum conduit. Terminal 172 is shown coupled to disk 162. A capacitor 174 having a fixed capacitance is coupled between terminal 172 and the disk 162. Terminal 176 is coupled to ring 164 and a variable capacitor 178 is electrically coupled therebetween. The variable capacitor may be adjusted to vary the effective impedance at terminal 176 and thus vary the RF power that is delivered to ring 164 through terminal 176 as compared to the power delivered to the disk 162 through terminal 172. The fixed and variable capacitors further operate to isolate the RF power supply 170 from the DC voltage applied to the grid to electrostatically clamp the substrate to the platen. RF power supply 170 creates an associated RF-induced DC bias on grid 160 independent of the bias created by DC power supply 166. The variability of the RF power delivered to the poles of grid 160 creates a variable and controllable DC bias between the disk 162 and ring 164. Disk 162 and grid 164 are electrically isolated elements, as illustrated by the gap 180 therebetween. Since the grids are effectively electrically isolated from each other, the RF power supply may be utilized to form different RF-induced DC biases between the disk 162 and ring 164. In that way, a DC voltage profile across platen surface 106 and across the substrate 111 is created on platen 110.

By varying the DC bias voltage profile across the substrate 111, nonuniformities within the plasma, and discrepancies within the etch process, may be addressed. For example, by biasing the outer edge of the substrate with a greater DC bias through higher voltage delivered to ring 164, the etch rate at the outer edge of the substrate might be increased to offset the greater plasma density and normally higher etch rate proximate the center of the substrate. Various different DC bias profiles and etch rates might be utilized in accordance with the principles of the present invention by varying the RF-induced DC bias between the grid poles and/or by varying the location of the different poles of the grid with respect to the substrate 111.

Typically, DC power supply 166 will be operable for providing a negative DC bias voltage in the range of –100 volts. The RF power supply, in one embodiment, might be operated at approximately 13.56 MHZ, and its output may be varied according to the invention to change the DC voltage profile across the substrate. Furthermore, while a concentric grid design is shown, utilizing a round disk and a circular ring, other grid designs might also be utilized. For example, a disk utilizing square shaped components such as a center square and an outer square boundary ring may be utilized.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A processing system for processing a substrate, the system comprising:

a process chamber having a top, a bottom and a sidewall for defining a process space therein, the process chamber having an opening in the sidewall thereof for providing access to the process space;

substrate support assembly configured for coupling with the process chamber to support a substrate within the process space, the substrate support assembly extending into the process space from the sidewall opening in the process chamber and sealed to the sidewall opening to generally isolate the process space from atmosphere, the substrate support assembly comprising a plenum, a tube, and a substrate mount coupled by the tube to the plenum and positioned in the process space;

the plenum having a conduit formed therein sealed from the process space and accessible from outside of the process chamber; and the tube being coupled between the plenum and the substrate mount so as to structurally support the substrate mount on the plenum, the tube being formed of a material having low thermal conductivity and limiting heat loss from the substrate mount to the plenum.

2. The processing system of claim 1 wherein said conduit is configured for providing access to the substrate mount from outside the process space.

3. The processing system of claim 2 wherein said substrate mount includes a heater, the system further comprising a heater control system coupled to the heater through the plenum conduit.

4. The processing system of claim 2 wherein said substrate mount includes an electrical grid operable for being biased to electrostatically hold a substrate to the substrate mount, the system further comprising a biasing supply coupled to the grid through the plenum conduit.

5. The processing system of claim 2 wherein said substrate mount includes a surface configured for receiving a substrate, the surface including at least one aperture therein for introducing a gas proximate a substrate placed on the surface, the system further comprising a supply of gas coupled to the surface aperture through the plenum conduit for delivering gas to the aperture.

6. The processing system of claim 4 wherein said biasing supply is one of an RF power supply and a DC power supply.

7. The processing system of claim 4 wherein the electrical grid is coupled to an RF power supply operable for inducing a DC bias on the electrical grid, the RF power supply having a variable output for creating a variable DC bias profile across the grid.

8. The processing system of claim 2 further comprising a cooling assembly coupled to the substrate mount, the system further comprising a supply of one of a cooling liquid and cooling gas coupled to the cooling assembly through the plenum conduit.

9. The processing system of claim 2 wherein said plenum comprises a sealing collar, the sealing collar configured for engaging the process chamber proximate the sidewall opening to seal the sidewall opening for sealing the process space from atmosphere.

10. The processing system of claim 2 further comprising a tube coupled between said plenum and the substrate mount, the tube having low thermal conductivity for limiting heat loss from the substrate mount to the plenum.

11. The processing system of claim 2 wherein said substrate mount is formed of a ceramic material.

12. The processing system of claim 2 wherein said substrate mount includes a platen.

13. The processing system of claim 2 wherein said substrate mount includes a mounting flange coupled to the platen, the mounting flange engaging the plenum for coupling the platen to the plenum.

14. The processing system claim 13 further comprising a tube coupled between said platen and the mounting flange, the tube having low thermal conductivity for limiting heat loss from the platen to the flange.

15. The processing system of claim 1 further comprising a plasma-generating assembly coupled with the process chamber for creating a plasma within the process space.

\* \* \* \* \*

UNITED STATES PATENT AND TRADEMARK OFFICE
CERTIFICATE OF CORRECTION

PATENT NO. : 6,395,095 B1
DATED : May 28, 2002
INVENTOR(S) : Jones et al.

It is certified that error appears in the above-identified patent and that said Letters Patent is hereby corrected as shown below:

Column 5,
Line 36, reads "plasmagenerating" and should read -- plasma-generating --.

Column 6,
Line 3, reads "plasmagenerating" and should read -- plasma-generating --.

Column 12,
Line 16, reads "substrate support" and should read -- a substrate support --.

Column 14,
Line 5, reads "The processing system claim 13" and should read -- The processing system of claim 13 --.

Signed and Sealed this

Twenty-first Day of January, 2003

JAMES E. ROGAN
*Director of the United States Patent and Trademark Office*